(12) United States Patent
Gießibl

(10) Patent No.: US 10,627,299 B2
(45) Date of Patent: Apr. 21, 2020

(54) MAGNETOELASTIC SHEAR FORCE SENSOR WITH INTERFERENCE FIELD COMPENSATION AND METHOD

(71) Applicant: Methode Electronics Malta Ltd., Mriehel (MT)

(72) Inventor: Johannes Gießibl, Amerang (DE)

(73) Assignee: Methode Electronics Malta Ltd., Birkirkara (MT)

( * ) Notice: Subject to any disclaimer, the term of this patent is extended or adjusted under 35 U.S.C. 154(b) by 0 days.

(21) Appl. No.: 16/055,260

(22) Filed: Aug. 6, 2018

(65) Prior Publication Data
US 2019/0041284 A1 Feb. 7, 2019

(30) Foreign Application Priority Data
Aug. 7, 2017 (DE) .......................... 10 2017 117 881

(51) Int. Cl.
*G01L 3/00* (2006.01)
*G01L 5/00* (2006.01)
(Continued)

(52) U.S. Cl.
CPC .............. *G01L 3/102* (2013.01); *G01L 1/125* (2013.01); *G01L 1/26* (2013.01); *G01L 5/0004* (2013.01); *G01R 33/07* (2013.01); *G01R 33/18* (2013.01)

(58) Field of Classification Search
CPC . G01L 3/102; G01L 1/125; G01L 1/26; G01L 5/0004; G01R 33/07; G01R 33/18
(Continued)

(56) References Cited

U.S. PATENT DOCUMENTS 4,506,554 A * 3/1985 Blomkvist .............. G01L 3/102
73/862.335
5,412,582 A * 5/1995 Hesthamar ............ F16B 31/028
702/43
(Continued)

FOREIGN PATENT DOCUMENTS

EP 2607873 A2 6/2013

OTHER PUBLICATIONS

German Search Report for German Application No. 10 2017 117 881.3, dated Jan. 18, 2018.

*Primary Examiner* — Max H Noori
(74) *Attorney, Agent, or Firm* — Carlson, Gaskey & Olds, P.C.

(57) ABSTRACT

A magnetoelastic shear force transducer with an interference field compensation comprises a hollow component section having an interior recess. A load can be applied onto the hollow component section. The load causes a shear stress in the hollow component section. The hollow component section includes at least one annular magnetoelastically active section having a magnetic polarization surrounding the recess and magnetoelastic properties. Magnetic-field sensors include at least one magnetic-field sensor in the magnetoelastically active section and a magnetic-field compensating sensor associated with the magnetic-field sensor in the magnetoelastically active section. The magnetic-field compensating sensor is arranged outside the magnetoelastically active section. A sensor signal of the magnetic-field sensor is processed along with a compensating signal of the magnetic-field compensating sensor to reduce the influence of an interfering magnetic field. A method of determining an optimum distance between the magnetic-field sensor and an associated magnetic-field compensating sensor is also disclosed.

28 Claims, 7 Drawing Sheets

(51) Int. Cl.
*G01L 3/10* (2006.01)
*G01L 1/26* (2006.01)
*G01L 1/12* (2006.01)
*G01R 33/07* (2006.01)
*G01R 33/18* (2006.01)

(58) Field of Classification Search
USPC .................................................. 73/862.333
See application file for complete search history.

(56) References Cited

U.S. PATENT DOCUMENTS

| | | | | |
|---|---|---|---|---|
| 5,646,356 | A * | 7/1997 | Ling | G01L 3/102 73/862.333 |
| 6,828,779 | B2 * | 12/2004 | Townsend | G01D 5/2013 324/207.12 |
| 7,836,783 | B2 * | 11/2010 | Lifvenborg | G01L 5/0004 73/862.69 |
| 8,087,304 | B2 | 1/2012 | Lee | |
| 2009/0230953 | A1 * | 9/2009 | Lee | G01R 33/07 324/244 |
| 2010/0242626 | A1 | 9/2010 | Weng | |
| 2014/0360282 | A1 | 12/2014 | Giessibl | |
| 2014/0360285 | A1 * | 12/2014 | Barraco | G01L 3/105 73/862.333 |
| 2017/0370788 | A1 | 12/2017 | Neuschaefer-Rube et al. | |
| 2018/0156676 | A1 | 6/2018 | Neuschaefer-Rube et al. | |
| 2018/0231425 | A1 * | 8/2018 | Raths Ponce | G01R 33/096 |

\* cited by examiner

MAGNETOELASTIC SHEAR FORCE SENSOR WITH INTERFERENCE FIELD COMPENSATION AND METHOD

CROSS-REFERENCE TO RELATED APPLICATION

This application claims priority to DE 10 2017 117 881.3, mailed 7 Aug. 2017.

FIELD OF INVENTION

The invention relates to an improved magnetoelastic shear force transducer with interference field compensation.

BACKGROUND OF THE INVENTION

Different designs of shear force transducers are known from the prior art. These shear force transducers usually use wire strain gauges to measure local deformations in a shear beam. The drawback however consists in that to this end, the shear beam has weakened regions in which these deformations are measured.

An alternative measuring principle is based on the magnetoelastic properties of a (permanently) magnetizable material. While in the magnetostriction an external magnetic field causes an elastic deformation and in particular a change in the shape of a body, a mechanical stress of a body leads to a change in the magnetic field thereof in the magnetoelastic effect.

A magnetoelastic shear force transducer based on this measuring principle is known by way of example from patent application US 2014360282 A1, the content of which is entirely incorporated into the present application by reference.

SUMMARY OF THE INVENTION

An object of the invention is to provide an improved magnetoelastic shear force transducer with an interference field compensation. A further object of the invention is a method of determining an optimum position of a magnetic field compensating sensor in a magnetoelastic shear force transducer. Further objects will result from the description below.

The magnetoelastic shear force transducer is configured to provide an output signal depending on a shear stress acting in the shear force transducer.

According to one aspect of the invention, the magnetoelastic shear force transducer comprises a hollow component section. The hollow component section extends at least in sections in a longitudinal direction. The hollow component section is configured hollow, i.e. it has an inner recess (also referred to as a cavity) along the longitudinal direction. The hollow component section may in particular have the form of a hollow cylinder and thus be substantially tubular. In other words, the hollow component section may also be a tube. The recess may advantageously be entirely sealed against humidity and dirt. The hollow component section can thus be closed on the front sides, for example by covers welded thereon. The inner sensor system permits the use of the shear force transducer in a multitude of different components, also in case of a restricted mounting space.

The hollow component section is configured such that a load can be applied thereon. The load may in particular be a transverse force or a shear force. The load causes the shear stress in the hollow component section.

The geometry and in particular the wall thickness of the hollow component section may be adapted to the load. The wall thickness should, for example, be chosen such that a shearing of the hollow component section or also only a plastic deformation of the hollow component section by the load is avoided.

According to a further aspect of the invention, the magnetoelastic shear force transducer comprises at least one annular magnetoelastically active section which is directly or indirectly connected to the hollow component section or which forms an integral part of the hollow component section.

The magnetoelastically active section has a magnetic polarization surrounding the recess and magnetoelastic properties. In other words, the magnetizable material in the magnetoelastically active section may be polarized in the tangential direction along the circumference. Due to the magnetoelastically active properties, the force action (strain) in the magnetoelastically active section leads to a deformation of the magnetic field resulting from the polarization of the magnetoelastically active section. This arrangement permits the sensing of shear forces by determining magnetic field components.

The magnetoelastically active section may be an integral part of the hollow component section. To this end, it is for example possible to magnetize an annular section of the hollow component section. In this case, the condition is that the hollow component section includes a magnetizable material.

Alternatively, the magnetoelastically active section may be formed separately from the hollow component section and be connected to the hollow component section, for example by adhesive bonding and/or pressing-in, only upon mounting of the shear force transducer. The one or another alternative may offer advantages in the manufacture depending on the case of application.

The hollow component section is in both cases configured such that the shear stress caused by the load is at least partially guided into the magnetoelastically active section. This permits the measurement of the shear stress.

According to a further aspect of the invention, the shear force transducer includes magnetic field sensors comprising at least one magnetic-field sensor in the magnetoelastically active section and at least one associated magnetic-field compensating sensor.

A first type of magnetic-field sensors and a second type of magnetic-field sensors are arranged in the shear force transducer. In the context of this specification, the first type and the second type may differ at least (or exclusively) in their position with respect to a respective associated magnetoelastically active section. The first type of magnetic-field sensors is arranged within the magnetoelastically active section. The second type of magnetic-field sensors is arranged outside the magnetoelastically active section. Both types of magnetic-field sensors may be configured identical in design and only differ in the positioning with regard to the magnetoelastically active section(s). The first type of magnetic-field sensors is intended for measuring a magnetic field change of the magnetic field of the magnetoelastically active section(s) impressed by the action of a (shear) stress. Though the second type of magnetic-field sensors is intended for measuring the interfering magnetic fields, it should at the same time, if possible, absorb no or only a low influence of the magnetic field change (to not reduce the sensitivity). The magnetic-field sensors outside the magnetoelastically active section(s) are referred to as magnetic-field compensating sensors to permit an easier distinction.

The at least one magnetic-field sensor in the magnetoelastically active section and the at least one magnetic-field compensating sensor and preferably all magnetic-field sensors are direction-sensitive magnetic-field sensors each having a sensing direction. In other words, the magnetic-field sensors sense the vector proportion of a magnetic field in the sensing direction. The direction sensitive magnetic-field sensors may, for example, be fluxgate magnetometers or Hall-effect sensors. The change in the magnetic field as a result of the shear stress is detected by the magnetic-field sensors.

The magnetic-field sensors may be arranged in the recess of the hollow component section and with the sensing directions extending substantially parallel to the longitudinal direction in an outer region of the recess. The shear forces may be sensed due to this arrangement.

According to a further aspect of the invention, the magnetic-field sensor in the magnetoelastically active section is arranged within the magnetoelastically active section. The magnetic-field compensating sensor associated with the magnetic-field sensor in the magnetoelastically active section is arranged outside the magnetoelastically active section and at a defined distance to the magnetic-field sensor in the magnetoelastically active section in the longitudinal direction. The magnetic-field sensor in the magnetoelastically active section, the magnetic-field compensating sensor and the magnetoelastically active section are to be arranged and configured such that the magnetic field of the magnetoelastically active section, more specifically the change in the magnetic field as a result of the shear stress is detected by the magnetic-field sensor in the magnetoelastically section.

For a good measuring result, the magnetic-field sensor in the magnetoelastically active section should thus preferably be arranged close to the wall of the magnetoelastically active section.

The interference field acting on the magnetic-field sensor in the magnetoelastically active section is to be detected and compensated by the magnetic-field compensating sensor. The magnetic-field compensating sensor should therefore be arranged as close as possible to the magnetic-field sensor in the magnetoelastically active section and preferably parallel to the longitudinal direction. The magnetic-field compensating sensor should at the same time be located far enough from the magnetoelastically active section such that, if possible, only the interference field is sensed rather than relevant proportions of the magnetic field originating from the magnetoelastically active section. The optimum distance of the magnetic-field compensating sensor to the associated magnetic-field sensor in the magnetoelastically active section must therefore preferably be determined experimentally or analytically.

It must be stated thereto that though the interference field itself is measured by the magnetic-field sensors and the interference field correspondingly falsifies the measuring results without compensation, the form of the interference field however considerably depends on the concrete fitting situation of the magnetoelastic shear force transducer.

The mechanical structure and the (magnetic) material properties of the mechanical structure and of the environment have a high influence on the form of the interference field. Expressed in a slangy manner, the mechanical structure may develop a "magnetic antenna effect" relatively regardless of the concrete form of the interference field and "distort" the interference field in the environment of the magnetoelastic shear force transducer such that the interference field heavily falsifies the measuring result.

According to the invention, a compensating signal of the magnetic-field compensating sensor may be processed along with a sensor signal of the magnetic-field sensor in the magnetoelastically active section to minimize an influence of an interfering magnetic field on the output signal. The magnetic-field sensor in the magnetoelastically active section and the magnetic-field compensating sensor may, for example, be electrically connected such that the signal of the magnetic-field compensating sensor is subtracted from the signal of the magnetic-field sensor in the magnetoelastically active section. Alternatively, the sensor signals can be sensed separately by an evaluation unit and can then be set against each other in accordance with predetermined rules. While the electric compensation simplifies the evaluation of the sensor signal, the evaluation using a calculating unit may also be based on complex rules in a very inexpensive way.

According to an advantageous aspect of the invention, the magnetic-field sensor in the magnetoelastically active section and the magnetic-field compensating sensor associated with the magnetic-field sensor in the magnetoelastically active section may be arranged such that their sensing directions are substantially coaxial and are in other words aligned. This improves the measuring result.

According to a further advantageous aspect of the invention, the magnetic-field sensor in the magnetoelastically active section and the magnetic-field compensating sensor may be arranged with the sensing directions extending in opposite directions and can thus be rotated by 180° with respect to each other about an axis perpendicularly to the sensing direction. This simplifies the compensation of the interference field.

According to a further advantageous aspect of the invention, the magnetic-field sensors may include the (first) magnetic-field sensor in the magnetoelastically active section and a second magnetic-field sensor in the magnetoelastically active section and the (first) magnetic-field compensating sensor and a second magnetic-field compensating sensor associated with the second magnetic-field sensor in the magnetoelastically active section.

The magnetic-field sensor in the magnetoelastically active section and the second magnetic-field sensor in the magnetoelastically active section may be located in a first plane. The first plane extends parallel to the longitudinal direction and perpendicularly to the longitudinal direction through an inner region of the recess. The arrangement of the plane should be chosen depending on the direction of the load action.

Preferably, the magnetic-field sensor in the magnetoelastically active section and the second magnetic-field sensor in the magnetoelastically active section may be arranged with the sensing directions extending in opposite directions. In the evaluation of the sensor signals with an evaluation unit, the magnetic-field sensors may however also be oriented in the same direction.

Advantageously, the second magnetic-field sensor in the magnetoelastically active section and the second magnetic-field compensating sensor may be arranged with the sensing directions extending substantially coaxially and in particular coaxially and in opposite directions.

In the computer-aided evaluation, the magnetic-field sensors may also be arranged in a different form. The reason therefor may, for example, be the geometry or the space available. The mathematical evaluation is however more complex.

According to a further advantageous aspect of the invention, the magnetic-field sensors may further have a third and a fourth magnetic-field sensor in the magnetoelastically active section and a third magnetic-field compensating sensor associated with the third magnetic-field sensor in the magnetoelastically active section and a fourth magnetic-field compensating sensor associated with the fourth magnetic-field sensor in the magnetoelastically active section.

The third magnetic-field sensor in the magnetoelastically active section and the fourth magnetic-field sensor in the magnetoelastically active section may be arranged in a second plane which also extends parallel to the longitudinal direction and perpendicularly to the first plane. The first plane and the second plane may in particular intersect in a central axis in the inner region of the recess along the longitudinal direction and preferably perpendicularly.

It may be advantageous if the third magnetic-field sensor in the magnetoelastically active section and the fourth magnetic-field sensor in the magnetoelastically active section are arranged with their sensing directions extending in opposite directions. Due to this aspect, the direction of the load action may be determined in a simple manner. The shear force transducer also detects all transverse forces or shear forces irrespective of the direction of the load action.

According to a further advantageous aspect of the invention, the third magnetic-field sensor in the magnetoelastically active section and the third magnetic-field compensating sensor are arranged with their sensing directions extending substantially coaxially, in particular coaxially and in opposite directions.

Alternatively or additionally, the fourth magnetic-field sensor in the magnetoelastically active section and the fourth magnetic-field compensating sensor may be arranged with the sensing directions extending substantially coaxially, in particular coaxially and in opposite directions. This aspect also improves the measuring result.

According to a further advantageous aspect, the magnetoelastic shear force transducer may include at least one holder. The holder may be configured to hold the magnetic-field sensors in a defined position within the recess.

The holder may in particular be configured to adjust the defined distance in the longitudinal direction between a magnetic-field sensor in the magnetoelastically active section of the magnetic-field sensors and a magnetic-field compensating sensor associated with the magnetic-field sensor in the magnetoelastically active section. The magnetic-field compensating sensor can, for example, be displaced or shifted on the holder. This permits the adaptation of the shear force transducer to the concrete fitting situation or the acting interference field.

According to a further advantageous aspect of the invention, the shear force transducer may further comprise an evaluation unit and a plurality of potential magnetic-field compensating sensors associated with a magnetic-field sensor in the magnetoelastically active section.

The evaluation unit may be configured to select at least one magnetic-field compensating sensor associated with the magnetic-field sensor in the magnetoelastically active section from the plurality of potential magnetic-field compensating sensors depending on an interfering magnetic field, and to assign it to this magnetic-field sensor in the magnetoelastically active section.

The at least one associated magnetic-field compensating sensor may be selected by comparative measurements (if necessary automated) with the objective of an optimization of sensitivity and/or linearity, and/or of a reduction of hysteresis and/or measuring errors. Due to this aspect, the adaptation of the shear force transducer can be carried out in a simple manner "inline", i.e. in the specific fitting situation (and, if necessary, even during operation).

According to a further advantageous aspect of the invention, the magnetoelastic shear force transducer may include a further (in particular a second) annular magnetoelastically active section having associated magnetic-field sensors.

The magnetoelastically active sections may be arranged so as to be spaced apart from each other in the longitudinal direction in or on the hollow component section.

The configuration of the further magnetoelastically active section and of the magnetic-field sensors associated with the further magnetoelastically active section may substantially correspond to the configuration of the first magnetoelastically active section and of the magnetic-field sensors associated with the first magnetoelastically active section. In particular, the number and the arrangement of the magnetic-field sensor may in principle be comparable. The distances of the respective magnetic-field compensating sensors to the associated magnetic-field sensors in the magnetoelastically active section may preferably be identical or also differ depending on the interfering magnetic field.

Such a shear force transducer is, for example, particularly suitable for double-ended shear beam load cells which are loaded in the center and similar loading cases. They can find application for example in forkheads and swivel heads of hydraulic and pneumatic cylinders, crane applications and in many other cases in which bolt, pin and screw connections are stressed by shearing.

An improved force-measuring bolt including a shear force transducer according to the invention is also provided. A force-measuring bolt according to the invention may replace conventional force-measuring bolts. In comparison with conventional force-measuring bolts having a strain gauge, the magnetoelastic measuring principle permits a considerably higher mechanical stress or overstress of the force-measuring bolt without any plastic deformation. Due to the compensation of the interference field, the measuring result is considerably improved. The sensor design with magnetic-field sensors arranged in the interior permits the measuring of shear forces in pins, bolts, screws and similar components.

An improved ball-and-socket joint having a shear force transducer according to the invention is also provided. The ball-and-socket joint includes a joint head and a joint socket. The at least one magnetoelastic shear force transducer may be arranged in or on the joint head and/or in or on the joint socket. A ball-and-socket joint improved in this way may, for example, be used in car manufacturing in wheel or axle suspensions, supporting joints for connecting a transverse link to a steering knuckle, tie-rod ends for connecting a tie rod to a MacPherson suspension strut or steering knuckle, or coupling rods for connecting a stabilizer to a transverse link or a suspension strut. Many other applications are conceivable.

An improved trailer-type device having at least one shear force transducer according to the invention is also provided. The trailer-type device may comprise a towing hook. The at least one magnetoelastic shear force transducer may be arranged in or on the towing hook. The trailer-type device may particularly comprise one or more and in particular two force-measuring bolts according to the invention.

A method of determining an optimum distance of a magnetic-field sensor in the magnetoelastically active section and of an associated magnetic-field compensating sensor for a magnetoelastic shear force transducer according to the invention depending on its fitting situation is also provided.

According to one aspect of the invention, the method of determining an optimum distance of a magnetic-field sensor in the magnetoelastically active section and of an associated magnetic-field compensating sensor comprises the placing of the magnetoelastic shear force transducer in the fitting situation or the model-type imitating of the fitting situation, for example by way of experiment or by means of a finite elements analysis. Owing to this aspect, the shear force transducer can be adapted to the specific fitting situation or the present interference field. The interference field can, for example, be produced by a residual magnetization of ferromagnetic materials or by electronic components.

According to a further aspect of the invention, the method of determining an optimum distance of a magnetic-field sensor in the magnetoelastically active section and of an associated magnetic-field compensating sensor comprises the determination (measuring) of the sensor signal of at least one magnetic-field sensor in the magnetoelastically active section and preferably of all magnetic-field sensors in the magnetoelastically active section of the magnetic-field sensors.

The method of determining an optimum distance of a magnetic-field sensor in the magnetoelastically active section and of an associated magnetic-field compensating sensor additionally comprises the determination of the compensating signals of at least one magnetic-field compensating sensor associated with the magnetic-field sensor in the magnetoelastically active section at different distances to the magnetic-field sensor in the magnetoelastically active section in the longitudinal direction.

According to a further aspect of the invention, the method of determining an optimum distance of a magnetic-field sensor in the magnetoelastically active section and of an associated magnetic-field compensating sensor comprises the processing of the sensor signal along with the compensating signals for the generation of output signals associated with the different distances. This can be carried out by experimental measurements and the record of the sensor signals and of compensating signals, or by an appropriate calculation using mathematical modelling.

According to a further aspect of the invention, the method of determining an optimum distance of a magnetic-field sensor in the magnetoelastically active section and of an associated magnetic-field compensating sensor comprises the selection of the optimum distance between the magnetic-field sensor in the magnetoelastically active section and the associated magnetic-field compensating sensor from the different distances and the associated output signals.

The selection can be based on an evaluation of the output signals associated with the distances concerning at least one property of the magnetoelastically shear force transducer, in particular the sensitivity, linearity, hysteresis and/or (error) deviation, for example.

According to a further advantageous aspect of the invention, the method of determining an optimum distance of a magnetic-field sensor in the magnetoelastically active section and of an associated magnetic-field compensating sensor can furthermore comprise the generation of magnetic interference fields during the determination of the sensor signals and of the compensating signals. The interference fields may be adapted to the fitting situation and/or application.

BRIEF DESCRIPTION OF THE DRAWINGS

The features and aspects of the invention are explained in detail below on the basis of example embodiments and with reference to the figures which show:

FIG. 1 a sectional view of a shear force transducer,

DETAILED DESCRIPTION

Figure 2:
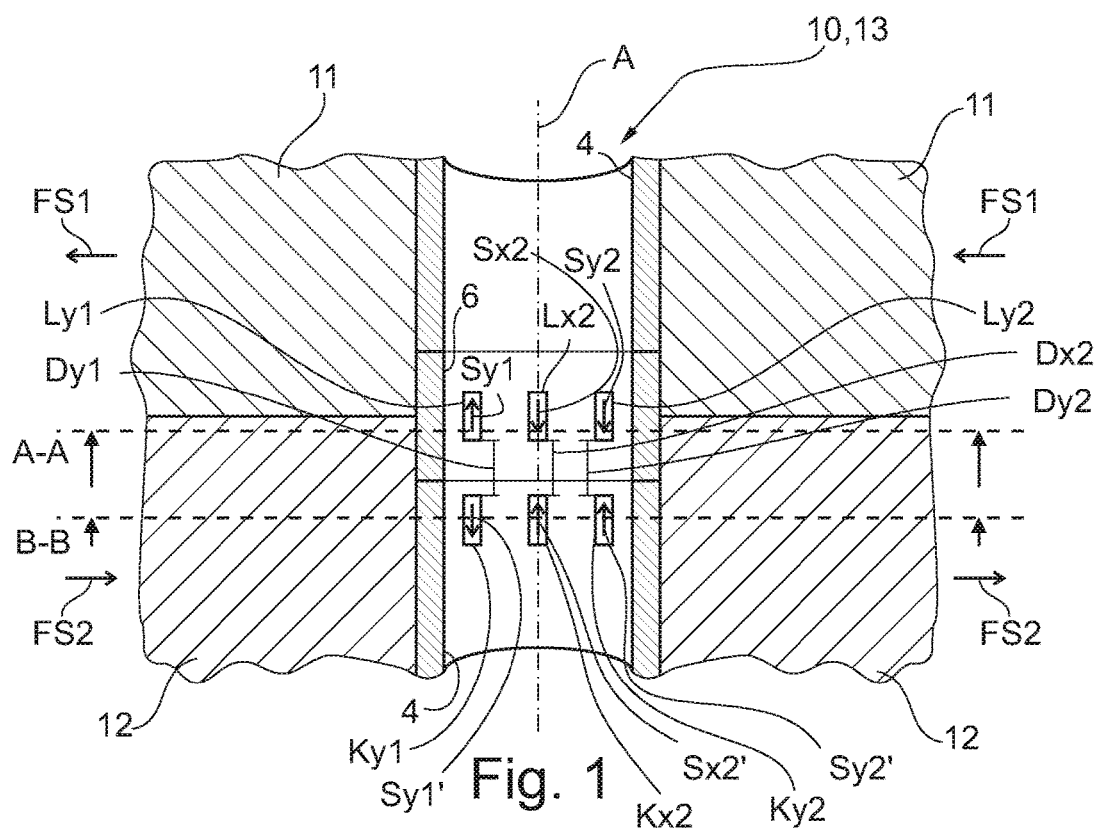
FIG. 2 a sectional view of the shear force transducer in the sectional plane A-A, FIG. 3 a sectional view of the shear force transducer in the sectional plane B-B, FIG. 4 a sectional view of a force-measuring bolt having a shear force transducer, with respectively different possible positions of the magnetic-field compensating sensors, FIG. 4b a sectional view of a force-measuring bolt having a shear force transducer, with respectively optimized positions of the magnetic-field compensating sensors, FIG. 5 a sectional view of a ball-and-socket joint having a shear force transducer, FIG. 6 a sectional view of the ball-and-socket joint in the sectional plane C-C, FIG. 7 a sectional view of a trailer-type device having a shear force transducer, FIG. 8 a schematic representation of a magnetic-field sensor in the magnetoelastically active section having a plurality of magnetic-field compensating sensors associated with the magnetic-field sensor in the magnetoelastically active section, and FIG. 9 a schematic representation of a method of determining an optimum distance between a magnetic-field sensor in the magnetoelastically active section and the associated magnetic-field compensating sensor.
Figure 3:
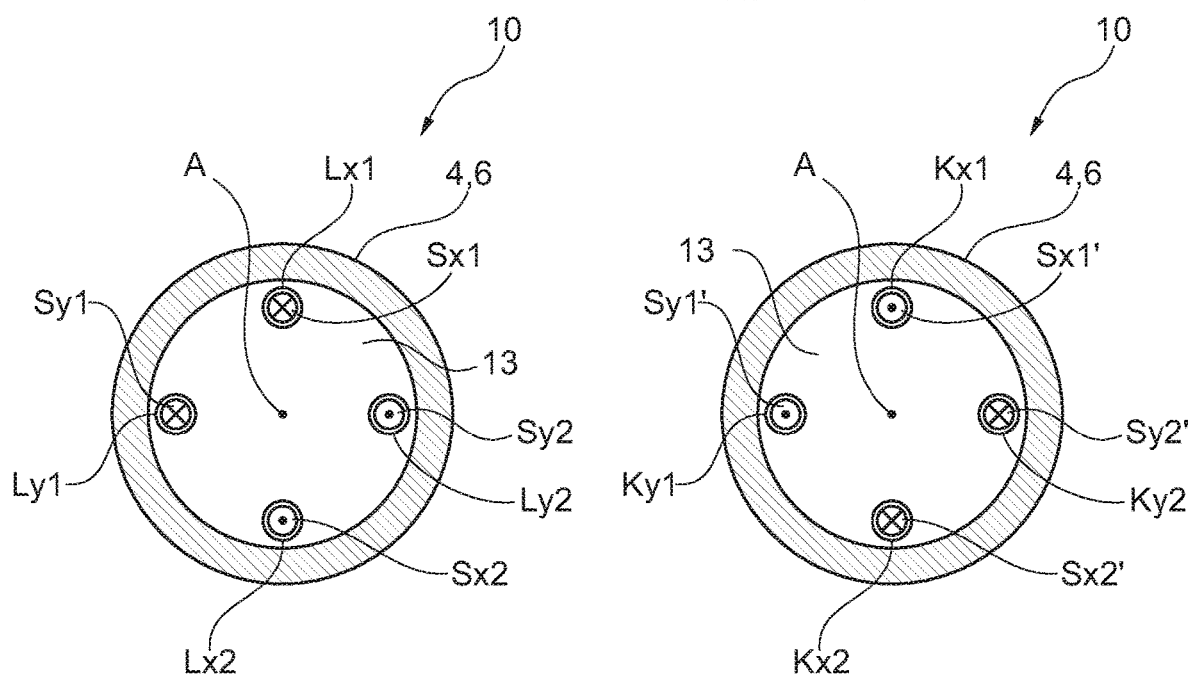

FIGS. 1 to 3 show an exemplary shear force transducer according to the invention.

FIG. 1 shows a sectional representation of the shear force transducer 10. The section is passed longitudinally through the shear force transducer 10, i.e. along the longitudinal direction A.

FIG. 2 shows a sectional representation of the shear force transducer 10 in a sectional plane perpendicularly to the longitudinal direction A and on the level of the magnetic-field sensors L in the magnetoelastically active section.

FIG. 3 shows a sectional representation of the shear force transducer 10 in a sectional plane perpendicularly to the longitudinal direction A and on the level of the magnetic-field compensating sensors K.

The magnetoelastic shear force transducer 10 is configured for the provision of an output signal depending on a shear stress acting in the shear force transducer 10.

The magnetoelastic shear force transducer includes a hollow component section 4, 6. The hollow component section 4, 6 extends at least in sections in a longitudinal direction A. The hollow component section 4, 6 has an interior recess 13 along the longitudinal direction A. The hollow component section 4,6 may in particular have the shape of a hollow cylinder.

The recess is advantageously entirely sealed against humidity and dirt. The hollow component section can thus be closed on the front sides by a cover welded thereon (not shown), for example.

The hollow component section 4, 6 is configured such that a load FS1, FS2 can be applied thereon. In the represented case, the load FS1, FS2 involves transverse or shear forces. The shear forces FS1, FS2 shear the hollow component section 4, 6 along the shear plane between the components 11, 12 in the region of the magnetoelastically active section 6. The load FS1, FS2 thus causes the shear stress in the hollow component section 4,6.

The magnetoelastic shear force transducer 10 comprises an annular magnetoelastically active section 6 which is directly or indirectly connected to the hollow component section 4, 6 or forms an integral part of the hollow component section 4, 6.

The magnetoelastically active section 6 has a magnetic polarization surrounding the recess 13 and magnetoelastic properties.

As represented here, the magnetoelastically active section 6 can be an integral part of the hollow component section 4,6. To this end, it is for example possible to magnetize an annular section 6 of the hollow component section 4, 6. To this end, the hollow component section includes a magnetizable material at least in the magnetoelastically active section 6.

The hollow component section 4, 6 is configured so as to guide the shear stress cause by the load FS1, FS2 into the magnetoelastically active section 6.

The shear force transducer 10 comprises magnetic-field sensors L, K (in the present example embodiment more specifically Lx1, Lx2, Ly1, Ly2, abbreviated L, and Kx1, Kx2, Ky1, Ky2, abbreviated K) having at least one (first) magnetic-field sensor Lx1 in the magnetoelastically active section and at least one (first) magnetic-field compensating sensor Kx1 associated with the magnetic-field sensor Lx1 in the magnetoelastically active section.

All magnetic-field sensors L, K are direction sensitive magnetic-field sensors each having a sensing direction Sx, Sy (for a better overview partially also represented by an arrow in the figures).

The direction sensitive magnetic-field sensors L, K are, for example, fluxgate magnetometers or Hall-effect sensors.

The magnetic-field sensors L, K are arranged in the recess 13 of the hollow component section 4, 6 and with the sensing directions S extending substantially parallel to the longitudinal direction A in an outer region of the recess 13.

The magnetic-field sensors L in the magnetoelastically active section are arranged within the magnetoelastically active section 6. The magnetic-field compensating sensor K associated with the magnetic-field sensor L in the magnetoelastically active section is arranged outside the magnetoelastically active section and at a defined distance to the magnetic-field sensor L in the magnetoelastically active section in the longitudinal direction. The magnetic-field compensating sensor Kx1 is, for example, assigned to the magnetic-field sensor Lx1 in the magnetoelastically active section, the magnetic-field compensating sensor Kx2 is assigned to the magnetic-field sensor Lx2 in the magnetoelastically active section, etcetera. For a better understanding, the same indices in the figures denote the respective associated magnetic-field sensors L, K.

The magnetic-field sensor L in the magnetoelastically active section, the associated magnetic-field compensating sensor K and the magnetoelastically active section 6 are arranged and configured such that the magnetic field of the magnetoelastic active section 6 or more specifically the change of the magnetic field as a result of the shear stress FS1, FS2 is detected by the magnetic-field sensor L in the magnetoelastically active section.

For a good measuring result, the magnetic-field sensor L in the magnetoelastically active section is therefore arranged close to the wall of the magnetoelastically active section 6.

The interference field acting on the magnetic-field sensor L in the magnetoelastically active section is to be detected by the magnetic-field compensating sensor K. This is why the magnetic-field compensating sensor K is arranged as close as possible to the magnetic-field sensor L in the magnetoelastically active section.

For a simpler evaluation, the magnetic-field sensor L in the magnetoelastically active section and the compensating sensor K are arranged parallel to the longitudinal direction A and in opposite directions.

The magnetic-field compensating sensor K is at the same time located far enough from the magnetoelastically active section 6 such that, if possible, only the interference field is sensed but not the magnetic field originating from the magnetoelastically active section 6. The optimum distance D (more specifically Dx1, Dx2, Dy1, Dy2) of the magnetic-field compensating sensor K to the associated magnetic-field sensor L in the magnetoelastically active section must therefore be determined experimentally or analytically.

According to the invention, a compensating signal of the magnetic-field compensating sensor K is processed along with a sensor signal of the respective magnetic-field sensor L in the magnetoelastically active section to minimize an influence of a magnetic interference field onto the output signal.

The magnetic-field sensor L in the magnetoelastically active section and the magnetic-field compensating sensor K may, for example, be electrically connected such that the signal of the magnetic-field compensating sensor K is subtracted from the signal of the magnetic-field sensor L in the magnetoelastically active section. This is, for example, the case if the magnetic-field sensor L in the magnetoelastically active section and the magnetic-field compensating sensor K are oriented in opposite directions (rotated by 180°) and are connected in series.

Alternatively, the sensor signals can be sensed separately by an evaluation unit and can then be set against each other in accordance with predetermined rules. While the electric compensation simplifies the evaluation of the sensor signal, the evaluation using a calculating unit may also be based on complex rules in a very inexpensive way.

The first magnetic-field sensor Lx1 in the magnetoelastically active section and the first magnetic-field compensating sensor Kx1 associated with the first magnetic-field sensor Lx1 in the magnetoelastically active section are arranged such that their sensing directions Sx1, Sx1' are substantially coaxial.

The first magnetic-field sensor Lx1 in the magnetoelastically active section and the first magnetic-field compensating sensor Kx1 are oriented such that their sensing directions Sx1, Sx1' point in opposite directions and are thus rotated with respect to each other by 180° about an axis perpendicularly to the sensing directions.

In addition to the first magnetic-field sensor Lx1 in the magnetoelastically active section and the first magnetic-field compensating sensor Kx1, the magnetic-field sensors L, K comprise a second magnetic-field sensor Lx2 in the magnetoelastically active section and a second magnetic-field compensating sensor Kx2 associated with the second magnetic-field sensor Lx2 in the magnetoelastically active section.

The (first) magnetic-field sensor Lx1 in the magnetoelastically active section and the second magnetic-field sensor Lx2 in the magnetoelastically active section are located in a first plane in the magnetoelastically active section. The first plane extends parallel to the longitudinal direction A and perpendicularly to the longitudinal direction A through an inner (central) region of the recess 13.

The arrangement of the first (and then sole) plane is to be chosen depending on the direction of the load action FS1, FS2, in particular if only two magnetic-field sensors Lx1, Lx2 are provided in the magnetoelastically active section.

The magnetic-field sensor Lx1 in the magnetoelastically active section and the second magnetic-field sensor Lx2 in the magnetoelastically active section are preferably arranged with the sensing directions Sx1, Sx2 extending in opposite directions. The first and second magnetic-field sensors Lx1, Lx2 in the magnetoelastically active section can be considered as a sole connected sensor in case of an appropriate electronic connection. The connected sensor already has a certain compensation of interference fields, the compensation working only in a restricted way due to the distance between the first and the second magnetic-field sensor and the component geometry. The compensation is considerably improved by the additional magnetic-field compensating sensors. In the alternative evaluation of the sensor signals using an evaluation unit, the magnetic-field sensors Lx1, Lx2 in the magnetoelastically active section may however also be oriented in the same direction.

Advantageously, the second magnetic-field sensor Lx2 in the magnetoelastically active section and the second magnetic-field compensating sensor Kx2 can be arranged with the sensing directions Sx2, Sx2' extending substantially coaxially and in particular coaxially and in opposite directions.

In a computer-aided evaluation, the magnetic-field sensors Lx1, Lx2, Kx1, Kx2 may also be arranged in a different form. The reason therefor can, for example, be the geometry or the space available.

In the present case, the magnetic-field sensors L, K further include a third and a fourth magnetic-field sensor Ly1, Ly2 in the magnetoelastically active section and a third magnetic-field compensating sensor Ky1 associated with the third magnetic-field sensor Ly1 in the magnetoelastically active section and a fourth magnetic-field compensating sensor Ky2 associated with the fourth magnetic-field sensor Ly2 in the magnetoelastically active section.

The third magnetic-field sensor Ly1 in the magnetoelastically active section Ly1 and the fourth magnetic-field sensor Ly2 in the magnetoelastically active section are arranged in a second plane which also extends parallel to the longitudinal direction A and which is formed perpendicularly to the first plane.

The first plane and the second plane intersect in a central axis A in the inner region of the recess 13 along the longitudinal direction.

The third magnetic-field sensor Ly1 in the magnetoelastically active section and the fourth magnetic-field sensor Ly2 in the magnetoelastically active section are arranged with their sensing directions Sy1, Sy2 extending in opposite directions. The direction of the load action can thus be determined in a simple manner.

The third magnetic-field sensor Ly1 in the magnetoelastically active section and the third magnetic-field compensating sensor Ky1 are arranged with their sensing directions Sy1, Sy1' extending substantially coaxially, in particular coaxially and in opposite directions.

Additionally, the fourth magnetic-field sensor Ly2 in the magnetoelastically active section and the fourth magnetic-field compensating sensor Ky2 are optionally arranged with the sensing directions Sy2, Sy2' extending substantially coaxially, in particular coaxially and in opposite directions.

The magnetoelastic shear force transducer 10 additionally includes at least one holder (not shown). The holder are configured to hold the magnetic-field sensors in a defined position within the recess.

Figure 4:
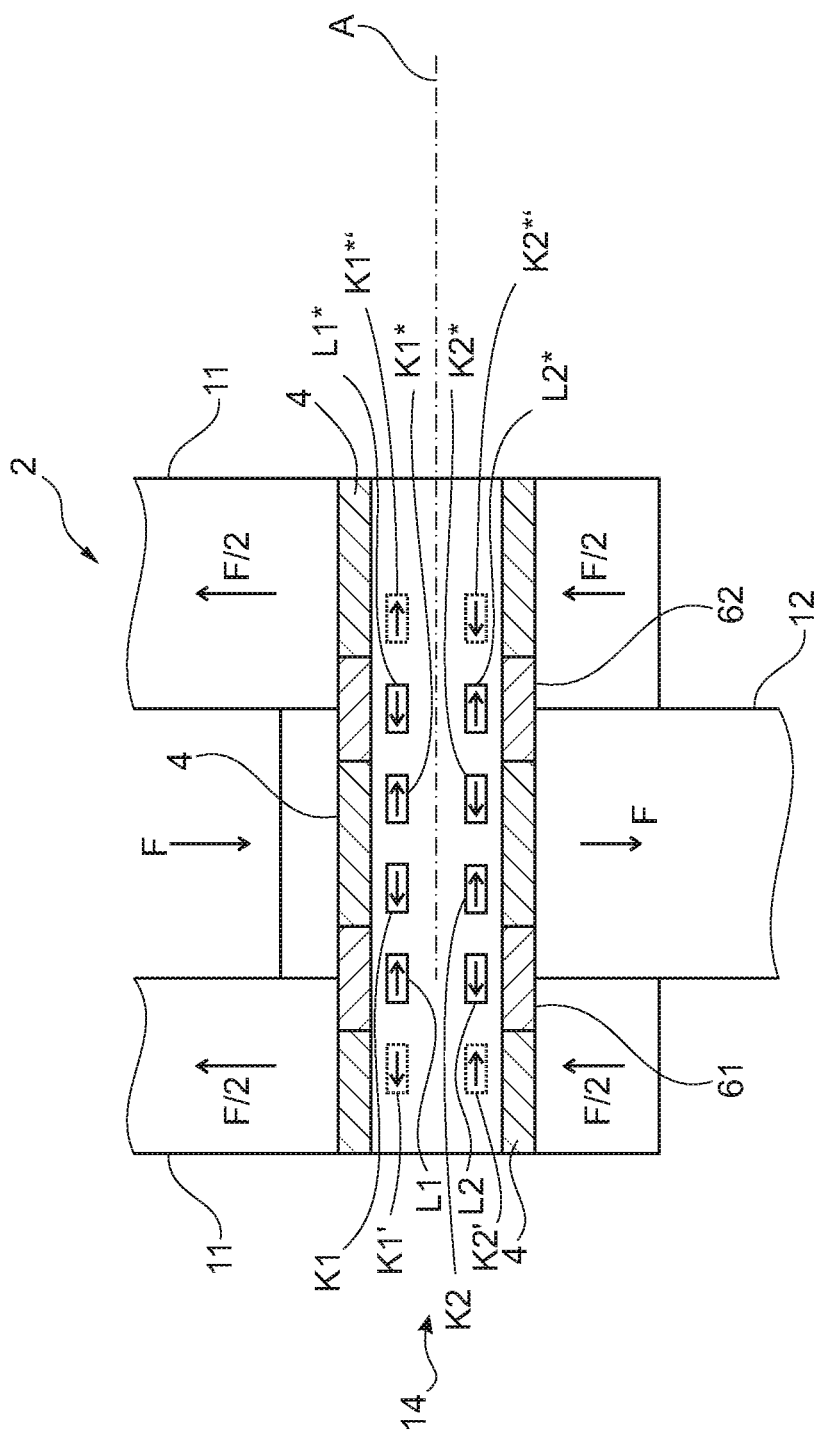

FIG. 4 shows a further exemplary shear force transducer 10 according to the invention in a sectional view. The section is passed longitudinally through the shear force transducer 10, i.e. along the longitudinal direction A. For a better understanding, only magnetic-field sensors L, L*, K, k* of the first plane are represented. Further magnetic-field sensors (not shown) may of course be present in a second plane. The arrangement and configuration can substantially correspond to the arrangement and configuration of the magnetic-field sensors L, L*, K, K* of the first plane.

In addition to the first magnetoelastically active section 61 with the associated magnetic-field sensors L, K, the magnetoelastic shear force transducer 14 includes a further (second) annular magnetoelastically active section 62 with associated magnetic-field sensors L*, K*.

Such a shear force transducer is, for example, particularly suitable for double-ended shear beam load cells which are loaded in the center and similar loading cases. A force-measuring bolt 14 having an integrated shear force transducer according to the invention is shown. The force-measuring bolt 14 according to the invention can replace conventional force-measuring bolts. They can find application for example in forkheads and swivel heads of hydraulic and pneumatic cylinders, crane applications and in many other cases in which bolt, pin and screw connections are stressed by shearing.

In the present case, the force-measuring bolt or shear force transducer 14 is stressed twice by shearing (in two parallel shear planes) by F/2 and F.

The magnetoelastically active sections 61, 62 are arranged in or on the hollow component section 4, 61, 62 so as to be spaced apart in the longitudinal direction A.

The configuration of the further magnetoelastically active section 62 and of the magnetic-field sensors L*, K* associated with the further magnetoelastically active section 62 can correspond to the configuration of the first magnetoelastically active section 61 and of the magnetic-field sensors L, K associated with the first magnetoelastically active section 61. In the present case, the design, the number and the arrangement of the magnetic-field sensors L, K are in principle comparable.

The magnetic-field compensating sensors K1, K1*, K2, K2* can each be arranged in front or behind the magnetic-field sensors L1, L1*, L2, L2' in the longitudinal direction. An arrangement is shown here, in which the magnetic-field compensating sensors K1, K1*, K2, K2* are arranged between the magnetoelastically active sections 61, 62. The magnetic-field compensating sensors K1*, K2* of the second magnetoelastically active section are arranged in front (i.e. on the left) of the associated magnetic-field sensors L1*, L2* in the second magnetoelastically active section 62. The magnetic-field compensating sensors K1, K2 of the second magnetoelastically active section are arranged behind (i.e. on the right) of the associated magnetic-field sensors L1, L2 in the first magnetoelastically active section 61.

However, the magnetic-field compensating sensors K1, K1*, K2, K2* can each also be positioned in alternative positions K1', K1*', K2', K2*' on the respective other side of the magnetic-field sensors L1, L1', L2, L2' in the magnetoelastically active sections 61, 62. The alternative positions are shown in dotted lines.

The corresponding magnetic-field compensating sensors K1, K2 and K1*, K2* of a magnetoelastic section can for example each be arranged on the same level in the longitudinal direction A, especially in symmetrical fitting situations.

Figure 4B:
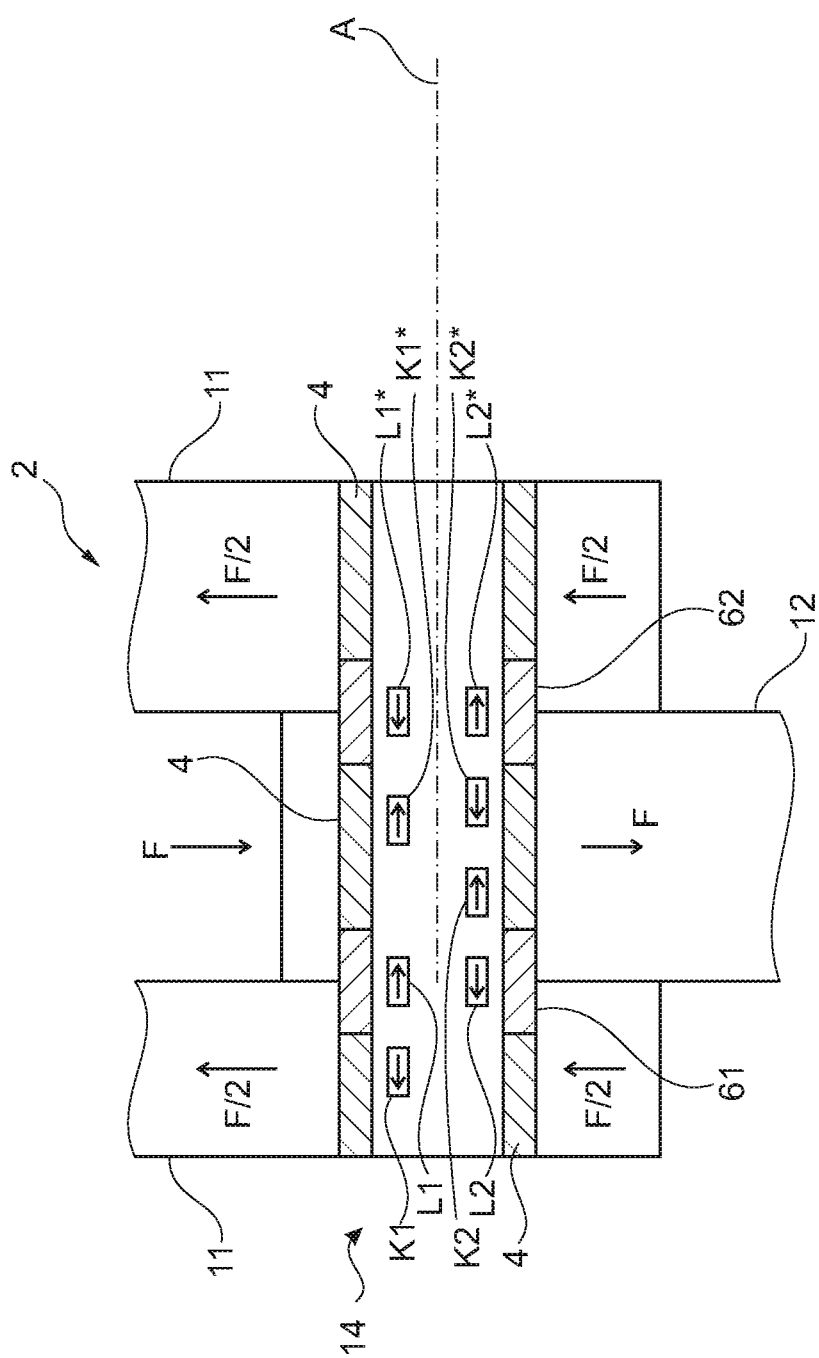

FIG. 4b shows the shear force transducer 10 according to the invention of FIG. 4 in a similar fitting situation and with a slightly differing (individually optimized) positioning of the magnetic-field compensating sensors K1, K1*, K2, K2*.

The distances of the respective magnetic-field compensating sensors K to the associated magnetic-field sensors L in the magnetoelastically active sections are in this case different depending on the interfering magnetic field.

The first magnetic-field compensating sensor K1* of the second magnetoelastically active section 62 is, for example, further away from the associated first magnetic-field sensor L1* in the first magnetoelastically active section than the first magnetic-field compensating sensor K1 of the first magnetoelastically active section 61 from the associated first magnetic-field sensor L1 in the first magnetoelastically active section.

It is also visible that in the example shown, due to the shape of the interference field, the magnetic-field compensating sensors K1, K1*, K2* are located on the left of the associated magnetic-field sensors L1, L1*, L2* in the magnetoelastically active sections, while the second magnetic-field compensating sensor K2 of the first magnetoelastically active section 61 is located on the right of the associated magnetic-field sensor L2 in the first magnetoelastically active section.

Figure 5:
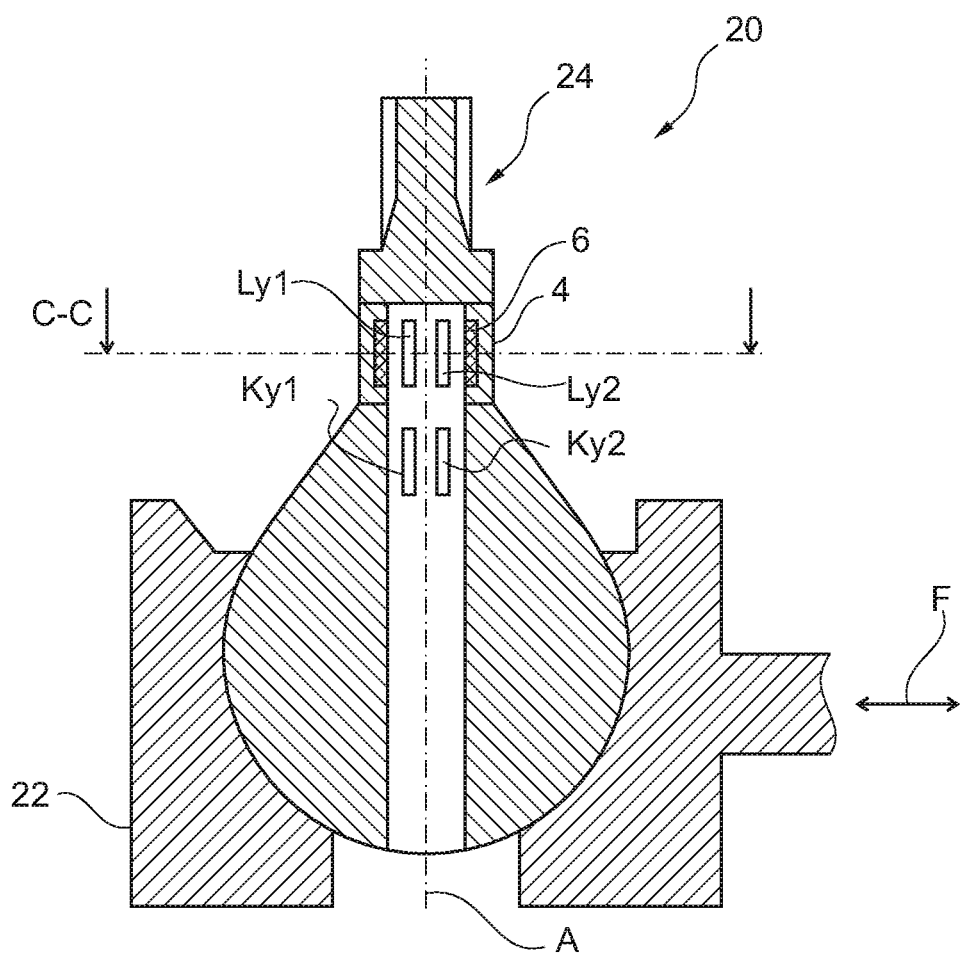

FIG. 5 shows a ball-and-socket joint 20 having a shear force transducer according to the invention in a sectional view. The section is passed longitudinally through the shear force transducer, i.e. along the longitudinal direction A.

Figure 6:
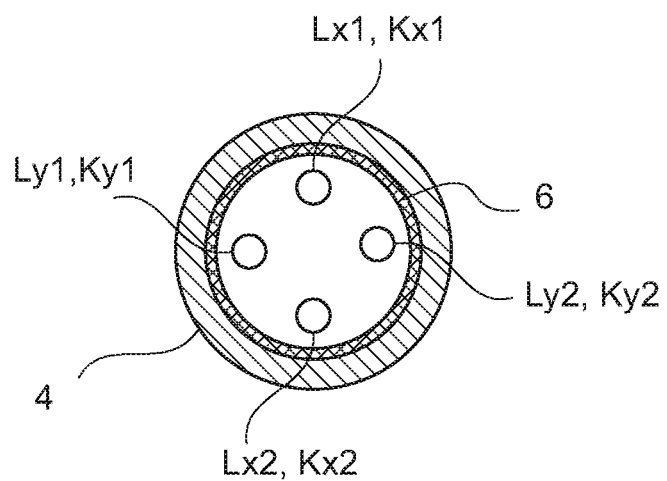

FIG. 6 shows a further sectional view of the ball-and-socket joint 20. The section is passed through the sectional plane C-C and perpendicularly to the longitudinal direction A.

The ball-and-socket joint 20 includes a joint head and a joint socket. The at least one magnetoelastic shear force transducer may be arranged in or on the joint head and/or in or on the joint socket. An arrangement in the joint head is shown. A ball-and-socket joint 20 improved in this way may, for example, be used in car manufacturing in wheel or axle suspensions, supporting joints for connecting a transverse link to a steering knuckle, tie-rod ends for connecting a tie rod to a MacPherson suspension strut or a tie rod to a steering knuckle, or coupling rods for connecting a stabilizer to a transverse link or a stabilizer to a suspension strut. Many other applications are conceivable.

In this example, the magnetoelastically active section 6 is formed separately from the hollow component section 4, 6 and can be connected to the hollow component section 4, 6 only upon mounting of the shear force transducer. In the present case, the magnetoelastically active section 6 can for example be connected to the remaining part of the hollow component section 4 by adhesive bonding and/or pressing-in.

The configuration of the magnetic-field sensors K, L itself is in principle comparable with the other example embodiments.

Figure 7:
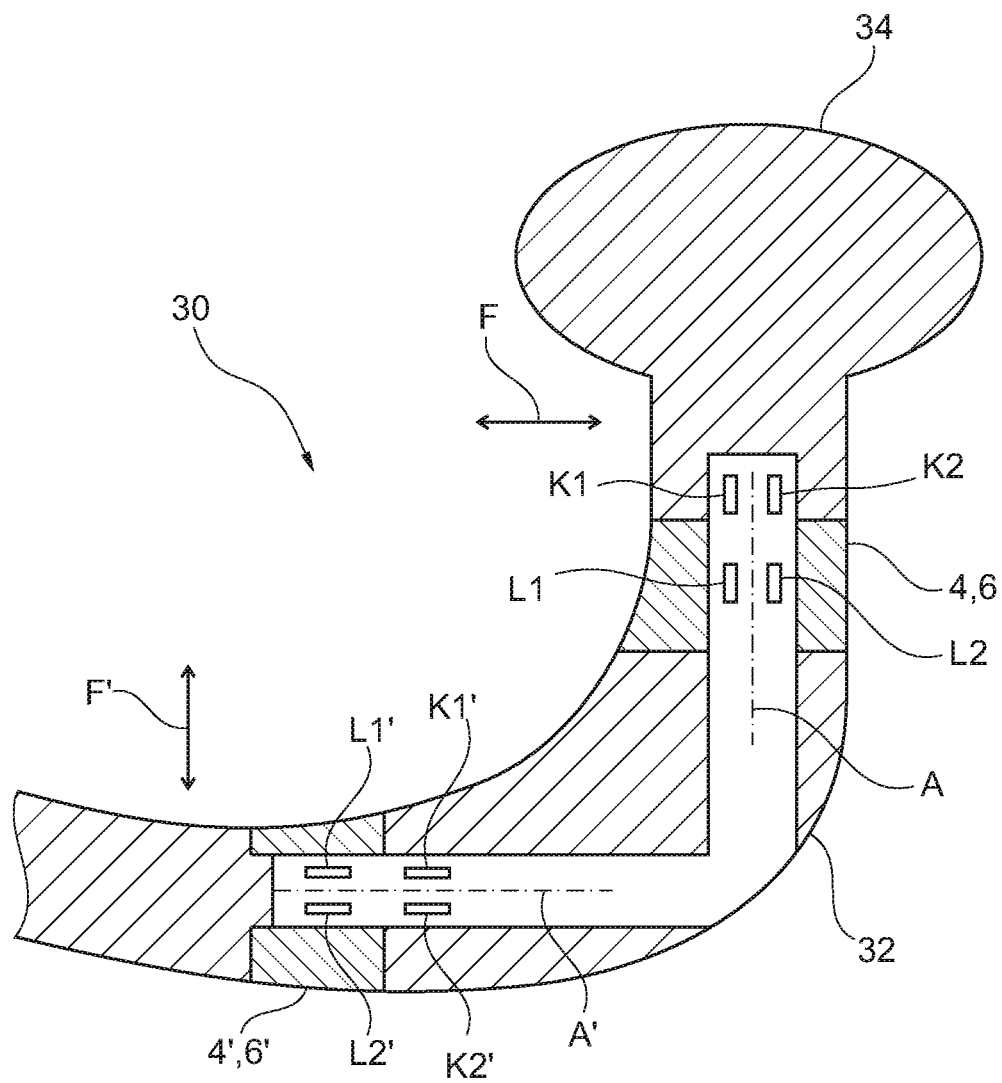

FIG. 7 shows an improved trailer-type device 30 having a shear force transducer according to the invention in a sectional view. The section is passed longitudinally through the shear force transducer, i.e. along the longitudinal directions A, A'.

The trailer-type device can comprise a towing hook 30. The at least one magnetoelastic shear force transducer can be arranged in or on the towing hook 30. The configuration of the magnetic-field sensors K, K', L, L' and of the hollow component section 4, 4', 6, 6' itself is in principle comparable with the other example embodiments. However, it has to be noted that the hollow component section 4, 4', 6, 6' extends only in sections along different longitudinal directions A, A' and has a non-rotationally symmetrical shape.

Alternatively, the trailer-type device can be composed of several parts and include one or more and in particular two force-measuring bolts according to the invention.

Figure 8:
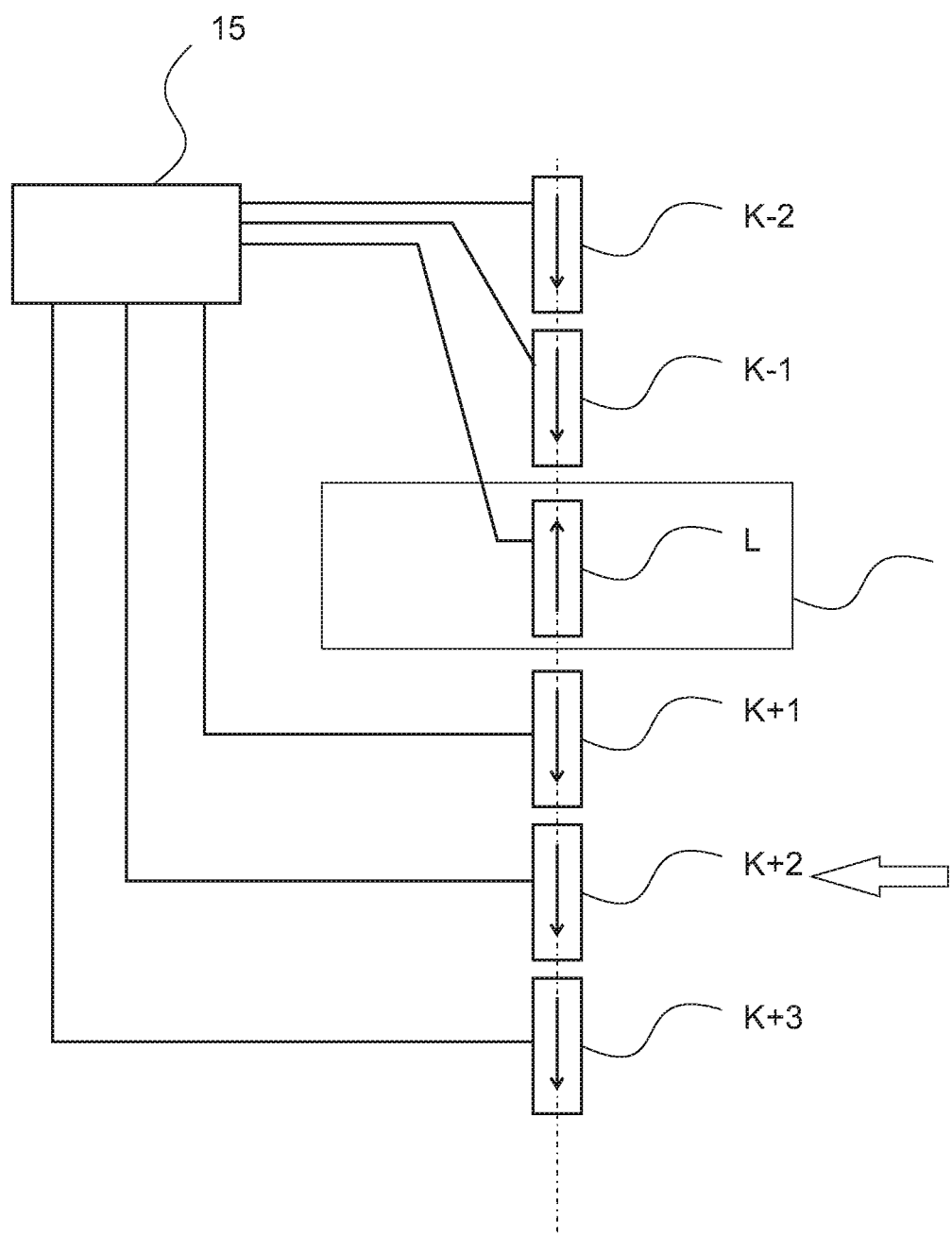

FIG. 8 shows a schematic representation of a shear force transducer which includes an evaluation unit 15 and a plurality of potential magnetic-field compensating sensors K−2 . . . K+3 associated with a magnetic-field sensor L in the magnetoelastically active section of the magnetic-field sensors L, K.

The evaluation unit 15 is configured to select at least one magnetic-field compensating sensor K+2 associated with the magnetic-field sensor in the magnetoelastically active section L from the plurality of potential magnetic-field compensating sensors K−2 . . . K+3 depending on a interfering magnetic field, and to assign it to this magnetic-field sensor in the magnetoelastically active section L.

The at least one associated magnetic-field compensating sensor K+2 can be selected by comparative measurements with the objective of an optimization of a value V, for example of the sensitivity and/or linearity and/or of a reduction of hysteresis and/or measuring errors. Due to this aspect, the adaptation of the shear force transducer can be performed in a simple manner "inline", i.e. in the specific fitting situation (and, if necessary, even during operation).

Figure 9:
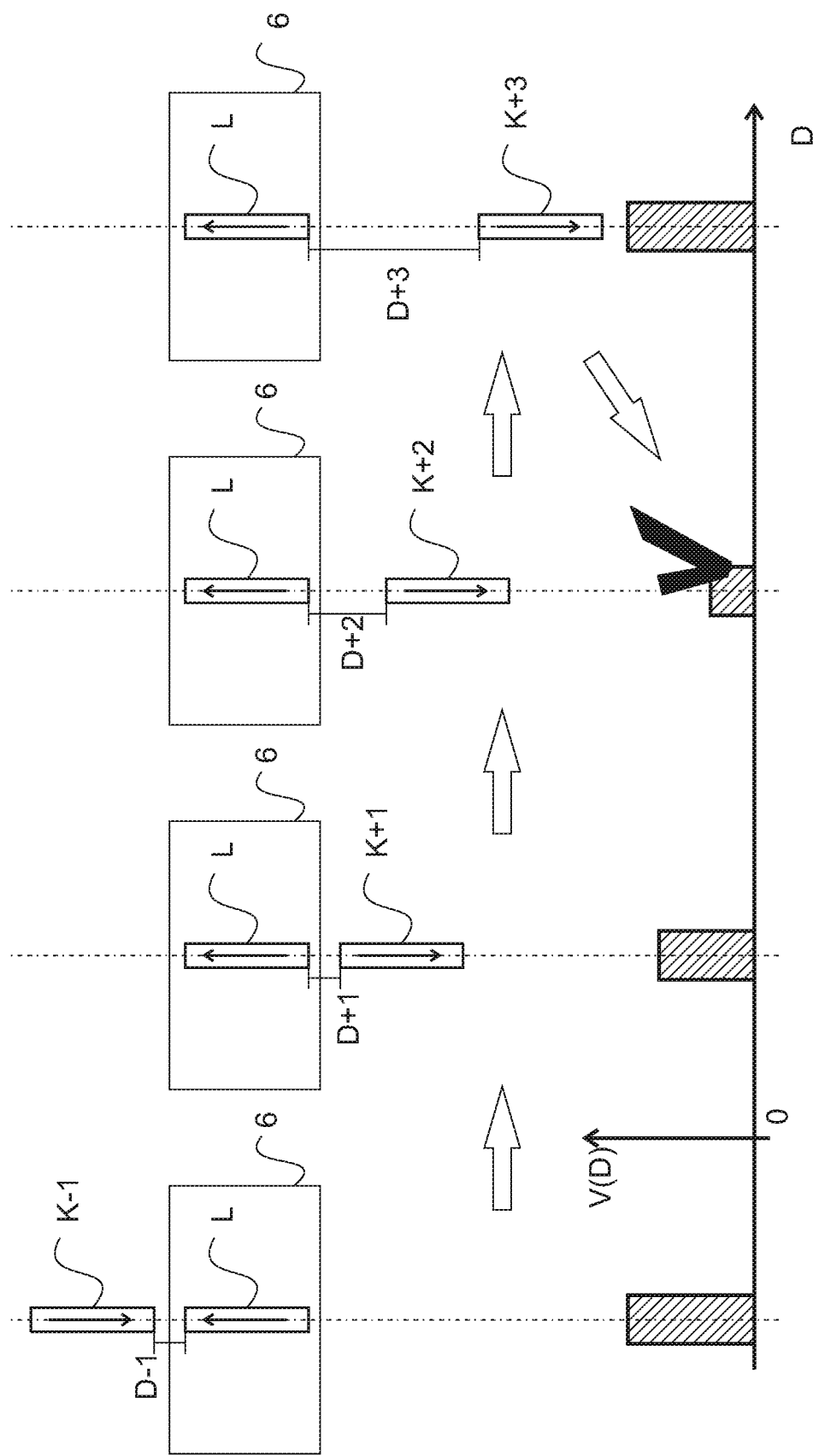

FIG. 9 shows a schematic representation of a method of determining an optimum distance D of a magnetic-field sensor L in the magnetoelastically active section and of an associated magnetic-field compensating sensor K for a magnetoelastic shear force transducer according to the invention depending on the fitting situation.

The magnetoelastic shear force transducer can, for example, include a holder, and the holder may in particular be configured to hold the magnetic-field sensors L, K in a defined position D within the recess. The holder means can in particular be configured to adjust the defined distance in the longitudinal direction A between a magnetic-field sensor L in the magnetoelastically active section of the magnetic-field sensors L, K and a magnetic-field compensating sensor K associated with the magnetic-field sensor L in the magnetoelastically active section.

Alternatively, the optimum distance D can be determined in tests or using models within the context of the design.

The method of determining an optimum distance D of a magnetic-field sensor L in the magnetoelastically active section and of an associated magnetic-field compensating sensor K for a magnetoelastic shear force transducer according to the invention depending on the fitting situation comprises the placing of the magnetoelastic shear force transducer in the fitting situation or the model-type imitating of the fitting situation, for example by way of experiment or by using a finite elements analysis.

The method of determining an optimum distance D of a magnetic-field sensor L in the magnetoelastically active section and of an associated magnetic-field compensating sensor K for a magnetoelastic shear force transducer according to the invention depending on the fitting situation further comprises the determination (measuring) of the sensor signal of at least one magnetic-field sensor L in the magnetoelastically active section and preferably of all magnetic-field sensors L in the magnetoelastically active section.

The method of determining an optimum distance D of a magnetic-field sensor L in the magnetoelastically active section and of an associated magnetic-field compensating sensor K for a magnetoelastic shear force transducer according to the invention depending on the fitting situation additionally comprises the determination of the compensating signals of at least one magnetic-field compensating sensor K associated with the magnetic-field sensor in the magnetoelastically active section at different distances D−1, D+1 . . . D+3 to the magnetic-field sensor L in the magnetoelastically active section in the longitudinal direction A.

The sensor signal is processed along with the compensating signals for the generation of output signals associated with the different distances D−1 . . . D+3. This can be carried out by experimental measurements and the record of the sensor signals and of the compensating signals or by an appropriate calculation using mathematical modelling.

The method of determining an optimum distance D of a magnetic-field sensor L in the magnetoelastically active section and of an associated magnetic-field compensating sensor K for a magnetoelastic shear force transducer according to the invention depending on the fitting situation furthermore comprises the selection of the optimum distance D between the magnetic-field sensor L in the magnetoelastically active section and the associated magnetic-field compensating sensor D+2 from the different distances D−1 . . . D+3 and the associated output signals.

The selection can be based on an evaluation of the output signals associated with the distances concerning at least one property of the magnetoelastic shear force transducer, in particular concerning a value V depending on the distances D, for sensitivity, linearity, hysteresis and/or (error) deviation, for example.

Depending on the property, the optimum can be in a local minimum (e.g. of the error deviation) and/or in a local maximum (e.g. of the sensitivity). An optimum value V in the local minimum is shown. The position K+2 with the distance D+2 is therefor selected as the optimum distance.

The method of determining an optimum distance D of a magnetic-field sensor L in the magnetoelastically active section and of an associated magnetic-field compensating sensor K for a magnetoelastic shear force transducer according to the invention depending on the fitting situation may optionally comprise the generation of magnetic interference fields during the determination of the sensor signal and of the compensating signals. The interference fields are generated only for determining the optimum distance D, but not in normal measuring operation.

The interference fields can be generated during the determination of the optimum distance D by electromagnets or permanent magnets, for example. The magnets can be mounted in at least one, but advantageously in different positions at or on the mechanical structure which surrounds the magnetoelastic shear force transducer in the fitting situation.

The invention claimed is:

1. A magnetoelastic shear force transducer for the provision of an output signal depending on a shear stress acting in the magnetoelastic shear force transducer, comprising:
   a hollow component section which extends in a longitudinal direction and has an interior recess along the longitudinal direction, the hollow component section being configured such that a load is applied thereon, and the load causing the shear stress in the hollow component section;
   at least one annular magnetoelastically active section which is directly or indirectly connected to the hollow component section or forms an integral part of the hollow component section such that the shear stress is guided into the at least one annular magnetoelastically active section, and the at least one annular magnetoelastically active section having a magnetic polarization surrounding the interior recess and magnetoelastic properties;
   magnetic-field sensors comprising at least one magnetic-field sensor in the at least one annular magnetoelastically active section and at least one associated magnetic-field compensating sensor, the at least one magnetic-field sensor in the at least one annular magnetoelastically active section and the at least one magnetic-field compensating sensor being direction-sensitive magnetic field sensors having each a sensing direction, the magnetic-field sensors being arranged in the interior recess of the hollow component section and with the sensing directions extending substantially parallel to the longitudinal direction in an outer region of the interior recess, the magnetic-field sensor in the at least one annular magnetoelastically active section being arranged within the at least one annular magnetoelastically active section, and the associated magnetic-field compensating sensor being arranged outside the at least one annular magnetoelastically active section and at a defined distance to the magnetic-field sensor in the at least one annular magnetoelastically active section in the longitudinal direction, and a compensating signal of the magnetic-field compensating sensor being processed along with a sensor signal of the magnetic-field sensor in the at least one annular magnetoelastically active section to minimize an influence of an interfering magnetic field onto the output signal, and
   wherein the magnetic-field sensors comprise the magnetic-field sensor in the at least one annular magnetoelastically active section and a second magnetic-field sensor in the at least one annular magnetoelastically active section and the magnetic-field compensating sensor and a second magnetic-field compensating sensor associated with the second magnetic-field sensor in the at least one annular magnetoelastically active section, and wherein the magnetic-field sensor in the at least one annular magnetoelastically active section and the second magnetic-field sensor in the at least one annular magnetoelastically active section are arranged in a first plane within the at least one annular magnetoelastically active section and the first plane extends parallel to the longitudinal direction and perpendicularly to the longitudinal direction through an inner region of the interior recess, and wherein the magnetic-field sensor in the at least one annular magnetoelastically active section and the second magnetic-field sensor in the at least one annular magnetoelastically active section are arranged with the sensing directions extending in opposite directions.

2. The magnetoelastic shear force transducer according to claim 1, wherein the magnetic-field sensor in the at least one annular magnetoelastically active section and the magnetic-field compensating sensor are arranged with the sensing directions extending substantially coaxially.

3. The magnetoelastic shear force transducer according to claim 1, wherein the magnetic-field sensor in the at least one annular magnetoelastically active section and the magnetic-field compensating sensor are arranged with the sensing directions extending in opposite directions.

4. The magnetoelastic shear force transducer according to claim 1, wherein the second magnetic-field sensor in the at least one annular magnetoelastically active section and the second magnetic-field compensating sensor are arranged with the sensing directions extending substantially coaxially and in particular coaxially and in opposite directions.

5. The magnetoelastic shear force transducer according to claim 1, wherein the magnetic-field sensors furthermore comprise a third and a fourth magnetic-field sensor in the at least one annular magnetoelastically active section and a third magnetic-field compensating sensor associated with the third magnetic-field sensor in the at least one annular magnetoelastically active section, and a fourth magnetic-field compensating sensor associated with the fourth magnetic-field sensor in the at least one annular magnetoelastically active section, and wherein the third magnetic-field sensor in the at least one annular magnetoelastically active section and the fourth magnetic-field sensor in the at least one annular magnetoelastically active section are located in a second plane and the second plane extends parallel to the longitudinal direction and is formed perpendicularly to the first plane, and wherein the first plane and the second plane in particular intersect in a central axis in an inner region of the interior recess along the longitudinal direction, and wherein the third magnetic-field sensor in the at least one annular magnetoelastically active section and the fourth magnetic-field sensor in the at least one annular magnetoelastically active section are in particular arranged with the sensing directions extending in opposite directions.

6. The magnetoelastic shear force transducer according to claim 5, wherein the third magnetic-field sensor in the at least one annular magnetoelastically active section and the third magnetic-field compensating sensor are arranged with the sensing directions extending substantially coaxially, in particular coaxially and in opposite directions, and wherein the fourth magnetic-field sensor in the at least one annular magnetoelastically active section and the fourth magnetic-field compensating sensor are arranged with the sensing directions extending substantially coaxially, in particular coaxially and in opposite directions.

7. The magnetoelastic shear force transducer according to claim 1, wherein the magnetoelastic shear force transducer includes at least one holder configured to hold the magnetic-field sensors in a defined position within the interior recess, and wherein the at least one holder is configured to adjust the defined distance in the longitudinal direction between a magnetic-field sensor in the at least one annular magnetoelastically active section and a magnetic-field compensating sensor associated with the magnetic-field sensor in the at least one annular magnetoelastically active section.

8. The magnetoelastic shear force transducer according to claim 1, comprising an evaluation unit and a plurality of potential magnetic-field compensating sensors associated with a magnetic-field sensor in the at least one annular magnetoelastically active section of the magnetic-field sensors, wherein the evaluation unit is configured to select at least one associated magnetic-field compensating sensor from the plurality of potential magnetic-field compensating sensors depending on an interfering magnetic field, and to assign the at least one associated magnetic-field compensating sensor to the magnetic-field sensor in the at least one annular magnetoelastically active section, and wherein the at least one associated magnetic-field compensating sensor is selected by comparative measurements and with regard to an optimization of sensitivity, linearity, hysteresis and/or deviation of the magnetoelastic shear force transducer.

9. The magnetoelastic shear force transducer according to claim 1, wherein the magnetoelastic shear force transducer includes a further annular magnetoelastically active section having associated magnetic-field sensors, and wherein the magnetoelastically active sections are arranged to be spaced apart in the longitudinal direction in or on the hollow component section.

10. A force-measuring bolt comprising:
a bolt body; and
the magnetoelastic shear force transducer according to claim 1.

11. A ball-and-socket joint comprising:
at least one magnetoelastic shear force transducer according to claim 1; and
wherein the ball-and-socket joint comprises a joint head and a joint socket and wherein the at least one magnetoelastic shear force transducer is arranged in or on the joint head and/or in or on the joint socket.

12. A trailer-type device comprising:
at least one magnetoelastic shear force transducer according to claim 1; and
wherein the trailer-type device comprises a towing hook and the at least one magnetoelastic shear force transducer is arranged in or on the towing hook, and wherein the trailer-type device comprises one or more, or two force-measuring bolts.

13. A method of determining an optimum distance of a magnetic-field sensor in at least one annular magnetoelastically active section and of an associated magnetic-field compensating sensor for a magnetoelastic shear force transducer depending on a fitting situation, the method comprising the steps of:
providing the magnetoelastic sheer force sensor according to claim 1;
placing the magnetoelastic shear force transducer in the fitting situation or model-type imitating the fitting situation;
detecting the sensor signal of a magnetic-field sensor in the at least one annular magnetoelastically active section of the magnetic-field sensors,
detecting the compensating signals of a magnetic-field compensating sensor associated with the magnetic-field sensor in the at least one annular magnetoelastically active section at different distances to the magnetic-field sensor in the at least one annular magnetoelastically active section in the longitudinal direction,
processing the sensor signal along with the compensating signals for the generation of output signals associated with the different distances, and
selecting the optimum distance between the magnetic-field sensor in the at least one annular magnetoelastically active section and the associated magnetic-field compensating sensor from the different distances on the basis of an evaluation of the associated output signals with regard to at least one property of the magnetoelastic shear force transducer, in particular sensitivity, linearity, hysteresis and/or error deviation.

14. The method according to claim 13, further comprising:
generating interfering magnetic fields during the detection of the sensor signals and of the compensating signals.

15. A magnetoelastic shear force transducer for the provision of an output signal depending on a shear stress acting in the magnetoelastic shear force transducer, comprising:
a hollow component section which extends in a longitudinal direction and has an interior recess along the longitudinal direction, the hollow component section being configured such that a load is applied thereon, and the load causing the shear stress in the hollow component section;
at least one annular magnetoelastically active section which is directly or indirectly connected to the hollow component section or forms an integral part of the hollow component section such that the shear stress is guided into the at least one annular magnetoelastically active section, and the at least one annular magnetoelastically active section having a magnetic polarization surrounding the interior recess and magnetoelastic properties;

magnetic-field sensors comprising at least one magnetic-field sensor in the at least one annular magnetoelastically active section and at least one associated magnetic-field compensating sensor, the at least one magnetic-field sensor in the at least one annular magnetoelastically active section and the at least one magnetic-field compensating sensor being direction-sensitive magnetic field sensors having each a sensing direction, the magnetic-field sensors being arranged in the interior recess of the hollow component section and with the sensing directions extending substantially parallel to the longitudinal direction in an outer region of the interior recess, the magnetic-field sensor in the at least one annular magnetoelastically active section being arranged within the at least one annular magnetoelastically active section, and the associated magnetic-field compensating sensor being arranged outside the at least one annular magnetoelastically active section and at a defined distance to the magnetic-field sensor in the at least one annular magnetoelastically active section in the longitudinal direction, and a compensating signal of the magnetic-field compensating sensor being processed along with a sensor signal of the magnetic-field sensor in the at least one annular magnetoelastically active section to minimize an influence of an interfering magnetic field onto the output signal; and an evaluation unit and a plurality of potential magnetic-field compensating sensors associated with a magnetic-field sensor in the at least one annular magnetoelastically active section of the magnetic-field sensors, wherein the evaluation unit is configured to select at least one associated magnetic-field compensating sensor from the plurality of potential magnetic-field compensating sensors depending on an interfering magnetic field, and to assign the at least one associated magnetic-field compensating sensor to the magnetic-field sensor in the at least one annular magnetoelastically active section, and wherein the at least one associated magnetic-field compensating sensor is selected by comparative measurements and with regard to an optimization of sensitivity, linearity, hysteresis and/or deviation of the magnetoelastic shear force transducer.

16. The magnetoelastic shear force transducer according to claim 15, wherein the magnetic-field sensor in the at least one annular magnetoelastically active section and the magnetic-field compensating sensor are arranged with the sensing directions extending substantially coaxially.

17. The magnetoelastic shear force transducer according to claim 15, wherein the magnetic-field sensor in the at least one annular magnetoelastically active section and the magnetic-field compensating sensor are arranged with the sensing directions extending in opposite directions.

18. The magnetoelastic shear force transducer according to claim 15, wherein the magnetic-field sensors comprise the magnetic-field sensor in the at least one annular magnetoelastically active section and a second magnetic-field sensor in the at least one annular magnetoelastically active section and the magnetic-field compensating sensor and a second magnetic-field compensating sensor associated with the second magnetic-field sensor in the at least one annular magnetoelastically active section, and wherein the magnetic-field sensor in the at least one annular magnetoelastically active section and the second magnetic-field sensor in the at least one annular magnetoelastically active section are arranged in a first plane within the at least one annular magnetoelastically active section and the first plane extends parallel to the longitudinal direction and perpendicularly to the longitudinal direction through an inner region of the interior recess, and wherein the magnetic-field sensor in the at least one annular magnetoelastically active section and the second magnetic-field sensor in the at least one annular magnetoelastically active section are arranged with the sensing directions extending in opposite directions.

19. The magnetoelastic shear force transducer according to claim 18, wherein the second magnetic-field sensor in the at least one annular magnetoelastically active section and the second magnetic-field compensating sensor are arranged with the sensing directions extending substantially coaxially and in particular coaxially and in opposite directions.

20. The magnetoelastic shear force transducer according to claim 18, wherein the magnetic-field sensors furthermore comprise a third and a fourth magnetic-field sensor in the at least one annular magnetoelastically active section and a third magnetic-field compensating sensor associated with the third magnetic-field sensor in the at least one annular magnetoelastically active section, and a fourth magnetic-field compensating sensor associated with the fourth magnetic-field sensor in the at least one annular magnetoelastically active section, and wherein the third magnetic-field sensor in the at least one annular magnetoelastically active section and the fourth magnetic-field sensor in the at least one annular magnetoelastically active section are located in a second plane and the second plane extends parallel to the longitudinal direction and is formed perpendicularly to the first plane, and wherein the first plane and the second plane in particular intersect in a central axis in an inner region of the interior recess along the longitudinal direction, and wherein the third magnetic-field sensor in the at least one annular magnetoelastically active section and the fourth magnetic-field sensor in the at least one annular magnetoelastically active section are in particular arranged with the sensing directions extending in opposite directions.

21. The magnetoelastic shear force transducer according to claim 20, wherein the third magnetic-field sensor in the at least one annular magnetoelastically active section and the third magnetic-field compensating sensor are arranged with the sensing directions extending substantially coaxially, in particular coaxially and in opposite directions, and wherein the fourth magnetic-field sensor in the at least one annular magnetoelastically active section and the fourth magnetic-field compensating sensor are arranged with the sensing directions extending substantially coaxially, in particular coaxially and in opposite directions.

22. The magnetoelastic shear force transducer according to claim 15, wherein the magnetoelastic shear force transducer includes at least one holder configured to hold the magnetic-field sensors in a defined position within the interior recess, and wherein the at least one holder is configured to adjust the defined distance in the longitudinal direction between a magnetic-field sensor in the at least one annular magnetoelastically active section and a magnetic-field compensating sensor associated with the magnetic-field sensor in the at least one annular magnetoelastically active section.

23. The magnetoelastic shear force transducer according to claim 15, wherein the magnetoelastic shear force transducer includes a further annular magnetoelastically active section having associated magnetic-field sensors, and wherein the magnetoelastically active sections are arranged to be spaced apart in the longitudinal direction in or on the hollow component section.

24. A force-measuring bolt comprising:
a bolt body; and
the magnetoelastic shear force transducer according to claim 15.

25. A ball-and-socket joint comprising:
at least one magnetoelastic shear force transducer according to claim 15; and
wherein the ball-and-socket joint comprises a joint head and a joint socket and wherein the at least one magnetoelastic shear force transducer is arranged in or on the joint head and/or in or on the joint socket.

26. A trailer-type device comprising:
at least one magnetoelastic shear force transducer according to claim 15; and
wherein the trailer-type device comprises a towing hook and the at least one magnetoelastic shear force transducer is arranged in or on the towing hook, and wherein the trailer-type device comprises one or more, or two force-measuring bolts.

27. A method of determining an optimum distance of a magnetic-field sensor in at least one annular magnetoelastically active section and of an associated magnetic-field compensating sensor for a magnetoelastic shear force transducer depending on a fitting situation, the method comprising the steps of:
providing the magnetoelastic sheer force sensor according to claim 15;
placing the magnetoelastic shear force transducer in the fitting situation or model-type imitating the fitting situation;
detecting the sensor signal of a magnetic-field sensor in the at least one annular magnetoelastically active section of the magnetic-field sensors,
detecting the compensating signals of a magnetic-field compensating sensor associated with the magnetic-field sensor in the at least one annular magnetoelastically active section at different distances to the magnetic-field sensor in the at least one annular magnetoelastically active section in the longitudinal direction,
processing the sensor signal along with the compensating signals for the generation of output signals associated with the different distances, and
selecting the optimum distance between the magnetic-field sensor in the at least one annular magnetoelastically active section and the associated magnetic-field compensating sensor from the different distances on the basis of an evaluation of the associated output signals with regard to at least one property of the magnetoelastic shear force transducer, in particular sensitivity, linearity, hysteresis and/or error deviation.

28. The method according to claim 27, further comprising:
generating interfering magnetic fields during the detection of the sensor signals and of the compensating signals.

* * * * *